United States Patent [19]

Thompson et al.

[11] Patent Number: 5,293,067
[45] Date of Patent: Mar. 8, 1994

[54] INTEGRATED CIRCUIT CHIP CARRIER

[75] Inventors: Kenneth R. Thompson, Sunrise; Kingshuk Banerji, Plantation; William B. Mullen, III, Boca Raton, all of Fla.

[73] Assignee: Motorola, Inc., Schaumburg, Ill.

[21] Appl. No.: 898,231

[22] Filed: Jun. 12, 1992

Related U.S. Application Data

[63] Continuation of Ser. No. 704,471, May 23, 1991, abandoned.

[51] Int. Cl.⁵ .................... H01L 23/02; H01L 23/12
[52] U.S. Cl. .................... 257/668; 257/673; 257/698; 257/730
[58] Field of Search ........... 174/261, 257; 361/400, 361/414; 357/68, 71, 72, 75, 80; 257/668, 673, 698, 730

[56] References Cited

U.S. PATENT DOCUMENTS

| | | | |
|---|---|---|---|
| 4,821,142 | 4/1989 | Ushifusa et al. | 361/395 |
| 4,893,172 | 1/1990 | Matsumoto et al. | 357/79 |
| 4,933,810 | 6/1990 | Cardashian et al. | 361/398 |
| 4,954,878 | 9/1990 | Fox et al. | 357/81 |
| 4,963,414 | 10/1990 | LeVasseur et al. | 361/397 |

FOREIGN PATENT DOCUMENTS

| | | | |
|---|---|---|---|
| 59-94441 | 5/1984 | Japan | 357/74 |
| 60-154632 | 8/1985 | Japan | 357/71 |
| 61-27667 | 2/1986 | Japan | 357/75 |
| 61-279164 | 12/1986 | Japan | 357/74 |
| 63-301552 | 12/1988 | Japan | 357/74 |
| 62052930591 | 2/1989 | Japan | 357/74 |
| 1-132150 | 5/1989 | Japan | 357/75 |
| 2-3263 | 1/1990 | Japan | 357/74 |

*Primary Examiner*—Jerome Jackson
*Assistant Examiner*—D. Monin
*Attorney, Agent, or Firm*—Dale W. Dorinski

[57] ABSTRACT

An integrated circuit chip carrier assembly, comprising a semiconductor device (10) having interconnection pads (14) disposed on an active surface (12) of the device. The device (10) is attached by means of electrically conducting bumps (26) to a circuitry pattern (18) on a first side of a circuit carrying substrate (16). The substrate is typically an aramid reinforced organic resin, such as epoxy. The circuitry (18, 20) is electrically connected by conductive through-holes (22) to an array of solder pads on a second side of the substrate. Some or all of the through-holes (22) are covered by the device. The overall length and width of the circuit carrying substrate (16) are each a maximum of about 0.15 inches greater than the equivalent dimensions of the device (10), creating a carrier that is only slightly larger than the semiconductor device itself.

14 Claims, 4 Drawing Sheets

INTEGRATED CIRCUIT CHIP CARRIER

This is a continuation of application Ser. No. 07/704,471, filed May 23, 1991, and now abandoned.

TECHNICAL FIELD

This invention relates generally to the field of integrated circuits and most particularly to a reduced size integrated circuit chip carrier.

BACKGROUND

The demand for manufacturing electrical assemblies with greater densities and smaller package size requires devising techniques to efficiently utilize the available area on a printed circuit board. One such technique is to directly bond the integrated circuit chip to corresponding contact points on a printed circuit board, thereby eliminating the necessity of using a chip carrier with a conventional ceramic or plastic cover or encapsulating the integrated circuit chip. The most popular method of directly bonding a chip to a circuit board is known as chip-on-board (COB). In chip-on-board, the integrated circuit is mounted directly on the circuit board and either wire bonded to the circuit board or bonded using TAB technology. This technique has been widely used in manufacturing of watches and other small electronic products. However, the integrated circuit chip is brittle and fragile and subject to stress and breakage if the circuit board is bent, vibrated or exposed to wide variations in temperature. Accordingly, in many applications such as two-way radios and other portable communication devices, where the electrical assembly is subject to vibration and severe environmental disturbances, direct connections between the integrated circuit chip and the circuit board are not desirable and can cause reliability problems.

Conventional ways of protecting and packaging the integrated circuit, such as chip carriers or transfer molded integrated circuit devices, provide a buffer substrate or mounting scheme between the integrated circuit and the circuit board, thereby reducing or eliminating the stress imparted to the chip during mechanical and thermal excursions. There are numerous drawbacks to the use of these types of chip carriers. Chip carriers are larger than the integrated circuit and typically require two to three times the area on the circuit board as the integrated circuit. The finished package is typically expensive and not repairable. The inability of repair a rather expensive package becomes a liability in electrical testing.

In chip-on-board technology, the density of lines and spaces required on the circuit board is extremely high, thereby creating a very complex printed circuit board with fine lines and spaces that is very expensive to manufacture. The use of chip carriers allows one to incorporate printed boards with less stringent line and space requirements, thereby reducing the cost of the printed circuit board. This cost reduction comes at the expense of using a larger chip carrier package which is more expensive and also has a greater height.

in chip-on-board technology, the semiconductor device is attached to the substrate by means of the control-collapse-chip-connection (known as C4). Typically, in order to achieve high yields and reliability in making a C4 connection, a clean room environment must be utilized during this process. One can easily see that the C4 process is not suitble for a normal manufacturing assembly environment where components are mounted onto circuit boards.

Clearly, a need exists for an integrated circuit package that can solve the problems of mechanical and thermal excursions, reduced size, utilize less dense (lower cost) printed circuit boards, provide chip carriers that can be electrically tested prior to assembly to the main circuit board, and does not require a clean room environment for assembly to the main circuit board.

SUMMARY OF THE INVENTION

Briefly, according to the invention, there is provided an integrated circuit device assembly comprising a semiconductor device with interconnecting pads arranged on an active surface of the device. The device is bonded to a substrate by attaching the device face down to corresponding circuit pads on the substrate. The circuit pads of the substrate are connected to solder pads on the opposite side of the substrate by conductive thru-holes. The integrated circuit device is connected to the substrate by electrically conductive bumps between the device pads and the substrate pads such that the device covers at least some of the conductive thru-holes on the substrate.

In another aspect of the invention, the gap between the device and the substrate may be filled with an organic coupling agent such as an epoxy resin.

DETAILED DESCRIPTION OF THE PREFERRED EMBODIMENT

Figure 1:
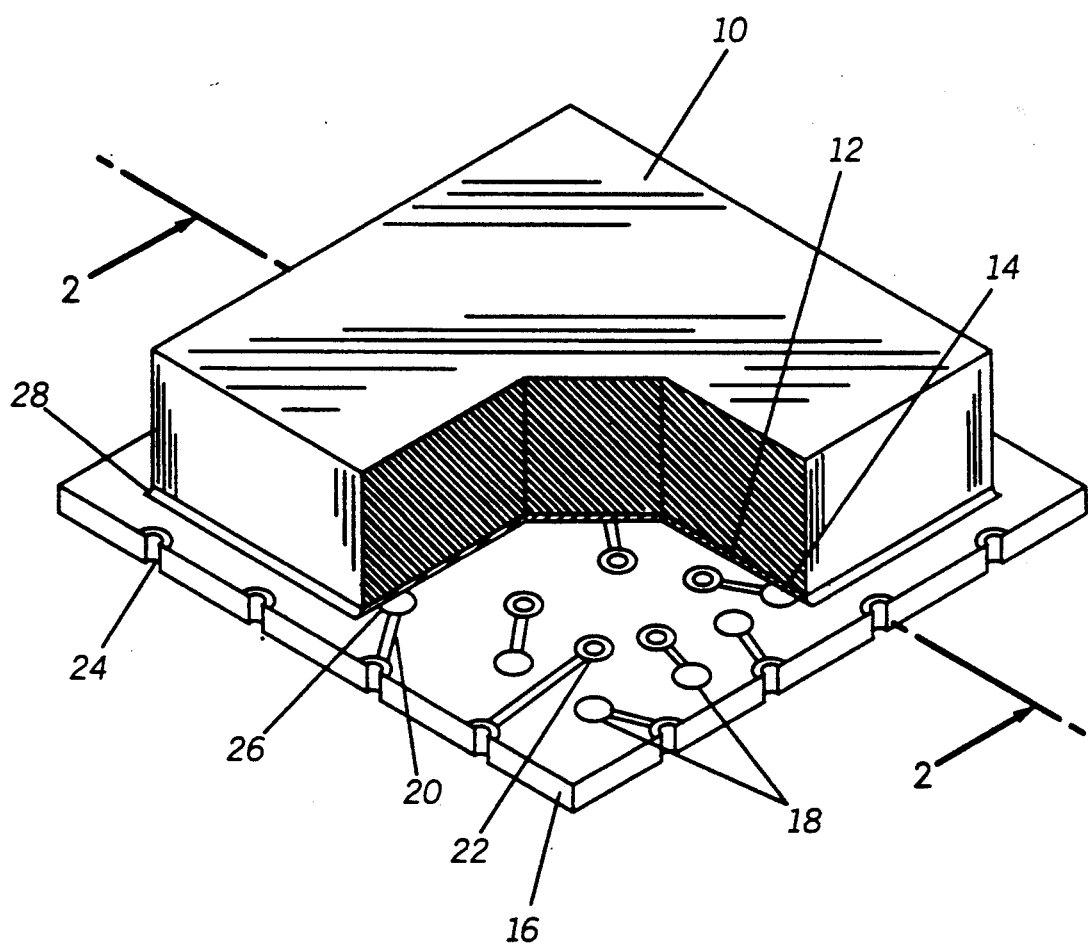
FIG. 1 is an isometric cut-away view of the integrated circuit chip carrier in accordance with the invention.

Referring now to FIG. 1, an integrated circuit or semiconductor device 10 contains an active surface 12 having interconnection pads 14 arranged in a configuration near the perimeter of the device. A circuit carrying substrate 16 has an array of interconnection pads 18 that correspond to the interconnect pads 14 of the device. The substrate material is typically a printed circuit board. Circuit boards made from materials with low expansion coefficients are preferred (between about 6 and about 18 in/in/°C×10$^{-6}$). One example of a useful material is Thermount E-215/CE laminate from the DuPont Corporation of Wilmington, Del. This laminate is an epoxy resin reinforced with aramid fiber. Other types of organic resin such as polyesters, polyamides, polyimides, and modifications or blends of these resins may also be employed in conjunction with the aramid reinforcements. Other types of substrates such as alumina ceramic, beryllium oxide, or aluminum nitride may also be effectively employed. In addition, the substrate 16 also contains other circuitry 20 that interconnects the pads to conductive thru-holes or vias 22 in the substrate. The circuitry 20 may also be connected to semicircular conductive thru-holes 24 on the perimeter of the substrate.

By utilizing an array of conductive thru-holes on the perimeter and the interior of the substrate, each of the integrated circuit interconnect pads 14 may be routed to a corresponding solder pad on the bottom of the substrate 16. In so doing, the lines and spaces required for the solder pads are much larger than those on the integrated circuit device since he entire surface of the substrate may be used. For example, spaces between interconnect pads on an integrated circuit device are typically 0.004 inches. By interconnecting the device to a substrate in this manner, the spacings between the solder pads on the bottom of the substrate may be as great as 0.030 inches. The solder pad diameters may be as great as 0.030 inches as opposed to 0.004 inches on the device interconnect pads.

The semiconductor device 10 is attached to the substrate by facing the active surface 12 of the device 10 toward the upper surface of the substrate 16. Interconnection of the device to the substrate is provided by means of conducive bumps 26 between the pads 14 of the device and the circuitry 18 of the substrate. These bumps may typically be made from solder or be thermocompression bonds, conductive epoxy, or conductive elastomer. If they are made from solder, the device is attached to the substrate by means of the control-collapse-chip-connection (C4). This type of connection is well known to those skilled in the art and has been utilized to achieve high-density circuitry. Typically, in order to achieve high yields and reliability in making a C4 connection, a clean room environment must be utilized and therefore the C4 process is most suitably employed early in the packaging process where the environment can be controlled. It should be appreciated that the chip carrier, in accordance with the present invention once completed, does not require a clean room environment in order to be attached to a main circuit board. The COB process, on the other hand, requires cleanroom conditions for assembly to the main circuit board.

After the integrated circuit is attached to the substrate, an organic coupling agent 28 may be applied in the gap between the integrated circuit and the substrate. This coupling agent may be, for example, a rigid adhesive such as an epoxy or a softer material such as a silicone. An example of a suitable coupling agent is Hysol FP 4510, an epoxy from the Dexter Corporation of Industry, California. The coupling agent serves to provide additional mechanical bonding between the device and the substrate and also serves as a stress relieving member. The third function of the coupling agent is to environmentally protect the active surface of the device and the interconnections. Depending on the application, the coupling agent may cover the entire gap between the device and the substrate or may only cover a portion of the active surface of the device.

Figure 2:
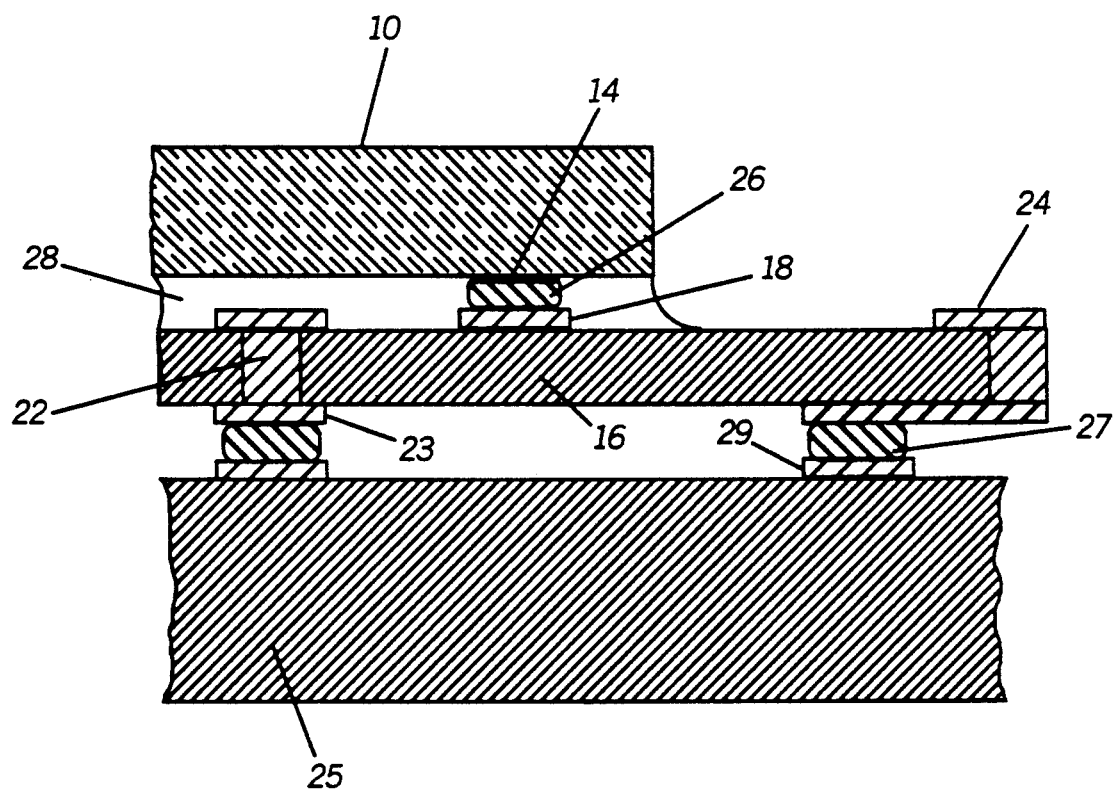
FIG. 2 is a cross section of the chip carrier of FIG. 1 through section 2—2.

Referring now to FIG. 2, it can be seen that the integrated circuit 10 lies over some of the conductive thru-holes 22. Each of the conductive thru-holes 22 connects to a solder pad 23 on the bottom side of the substrate 16. The organic coupling agent or underfill material 28 fills the gap between the device 10 and the substrate 16. The interconnect pads 14 of the device 10 are connected to the circuitry pads 18 of the substrate by means of a metallic bump 26. As can be seen in FIGS. 1 and 2, the overall size of the substrate 16 is only slightly larger than the overall size of the integrated circuit 10. Typically, the length and width of the substrate is no greater than 0.15 inches greater than the length and width of the device and may be as small as the device itself in some cases. Typically, the substrate is 0.025 to 0.1 inches greater than the largest dimension of the device.

The assembled integrated circuit chip carrier may now be electrically tested with conventional testing equipment, without having to resort to expensive and complex semiconductor testing equipment. Since the carrier is tested at a package level, the testing regime can be more thorough, and does not require the complexity and minaturization necessary for testing at the wafer level.

The assembly may now be placed onto a printed circuit board 25 by any number of interconnection schemes. For example, the integrated circuit assembly may be attached to the circuit board by solder joints as in the C5 process (controlled collapse chip carrier connection) or it may be attached using elastomeric interconnects of hot-melt adhesive interconnects. In the case of the C5 connections, solder joints 27 are achieved by reflowing solder balls between the assembly and the circuit board.

Figure 3:
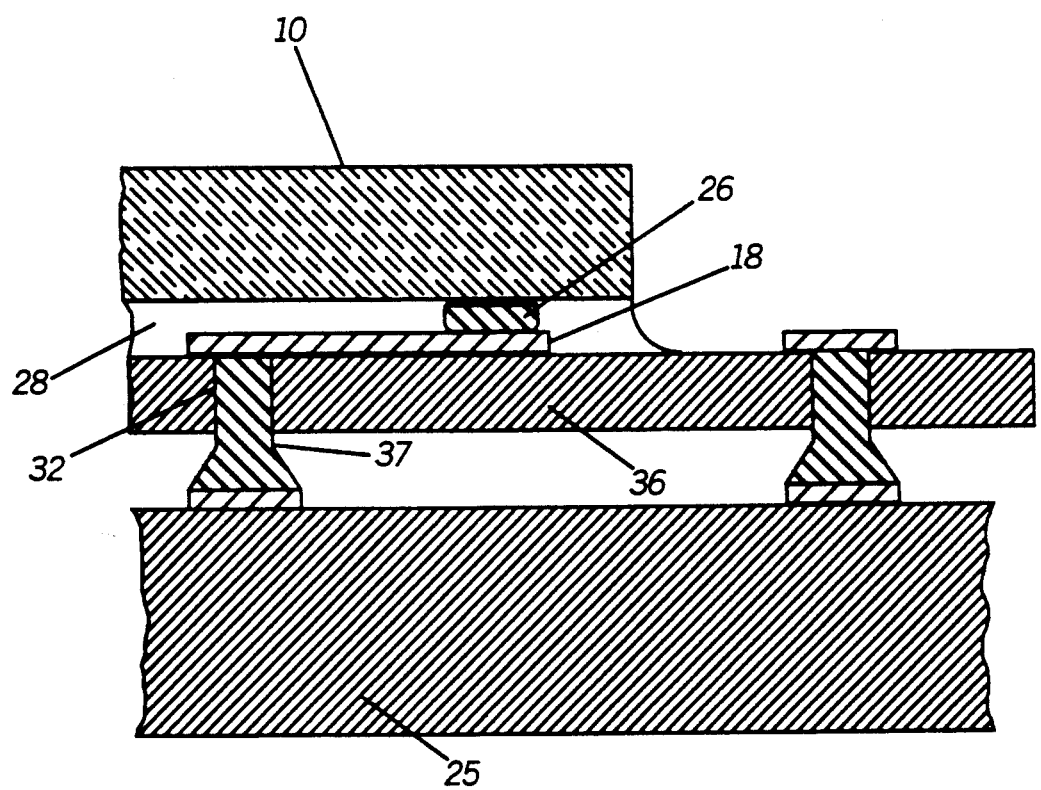
FIG. 3 is a cross section of an alternate embodiment of the chip carrier of FIG. 1 through section 2—2.

Referring to FIG. 3, an alternate embodiment of the invention comprises attaching the semiconductor device 10 to a substrate 36 containing circuitry patterns 18 on one side only. The device 10 is directly attached via solder bumps 26 to the circuitry pattern on the top side of the substrate 36 to create a chip carrier assembly. The circuitry pattern extends to a hole 22 in the substrate, and may terminate in an annular ring around the hole or may cover the hole entirely so as to tent the hole. The assembly may contain the above referenced organic coupling agent 28 is desired. In order to connect the assembly to a printed circuit board 25 (PCB), the carrier is soldered to the PCB using additional, usually larger, solder bumps 37. The solder bumps 37 are soldered to the circuitry pattern 18 by forming the bumps in the substrate hole 32 so that the solder 37 connects to the back side of the circuitry pattern 18.

Figure 4:
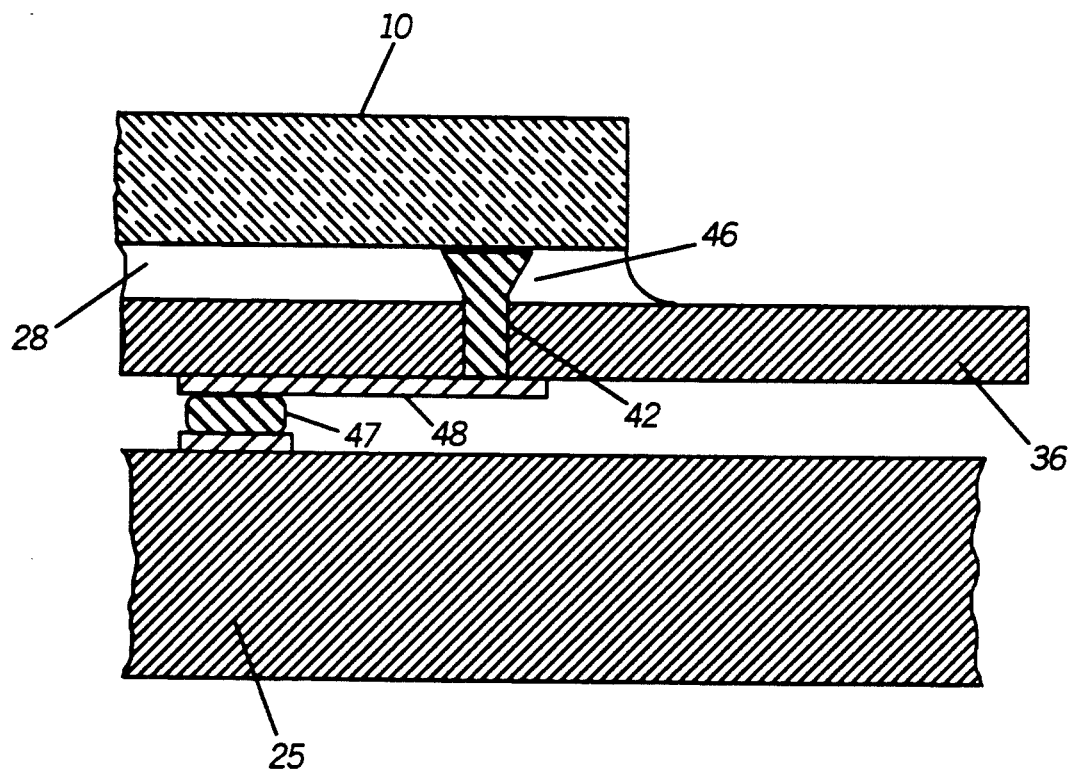
FIG. 4 is a cross section of an alternate embodiment of the chip carrier of FIG. 1 through section 2—2.

In a further embodiment of the invention illustrated by way of FIG. 4, a semiconductor device 10 is attached to a substrate 46 having a circuitry pattern 48 on the back side of the substrate. The device is connected to the back side of the circuitry pattern via a series of solder bumps 46 that extend through a hole 42 in the substrate to create a chip carrier assembly. As in previous examples, the assembly may contain the above referenced organic coupling agent 28 if desired. In order to connect the assembly to a printed circuit board 25, the carrier is soldered to the PCB using additional, usually larger, solder bumps 47. The solder bumps 47 are soldered to the circuitry pattern 48 and the PCB 25 using, for example, a C5 process.

A package created in accordance with the invention provides numerous advantages, amongst which are: a package with a smaller footprint than conventional chip carrier packages, a package with a footprint only slightly larger than the actual size of the integrated circuit itself, a package with significantly reduced height (only slightly greater than the height of the integrated circuit), a package that may be easily tested prior to assembly to a main circuit board, and a package that does not require clean room environments for assembling an integrated circuit to a main circuit board. The present invention satisfies a long-existing need for an improved integrated circuit chip carrier that is smaller in size, more reliable, lower cost, easier to manufacture, and is electrically testable. It will be apparent from the foregoing that while particular forms of the invention have been illustrated and described, various modifications can be made without departing from the spirit and the scope of the invention. The examples shown in FIG.

1 and FIG. 2 herein, while illustrative, are not meant to be considered limiting and other configurations of the present invention may by envisioned to fall within the scope of the invention. Accordingly, it is not intended that the invention be limited except as by the appended claims.

What is claimed is:

1. A semiconductor device assembly, comprising:
   an integrated circuit chip having a length, a width, and an active surface having interconnection pads disposed thereon, and electrically conducting bumps on the interconnection pads;
   a circuit carrying substrate having;
      a length, a width, a top side, and a bottom side; plated through holes;
      a metallization pattern on the top side, comprising bonding pads corresponding to the integrated circuit chip interconnection pads, the bonding pads connected by conductive runners to corresponding plated through holes positioned away from the bonding pads; and
      an array of solder pads on the bottom side, connected to the metallization pattern by the plated through holes, the distance between the individual solder pads being greater than the distance between the individual bonding pads; and
   the integrated circuit chip attached to the bonding pads by means of the electrically conducting bumps, at least some of the plated through holes being covered by the active surface of the integrated circuit chip, and the length and width of the curcuit carrying substrate, each being a maximum of about 0.1 inches greater than the length and width of the integrated circuit chip.

2. The semiconductor device assembly of claim 1, further comprising an organic coupling agent disposed between the integrated circuit chip and the substrate, covering at least a portion of the active surface.

3. The semiconductor device assembly of claim 2, wherein the organic coupling agent comprises epoxy.

4. The semiconductor device assembly of claim 1, wherein the circuit carrying substrate comprises alumina ceramic.

5. The semiconductor device assembly of claim 1, wherein the circuit carrying substrate comprises an organic resin reinforced with aramid.

6. The semiconductor device assembly of claim 1, wherein the electrically conducting bumps comprise solder.

7. A semiconductor device assembly, comprising:
   an integrated circuit chip having a length, a width, and an active surface having interconnection pads disposed thereon, and electrically conducting bumps on the interconnection pads;
   a circuit carrying substrate having;
      a length, a width a top side, and a bottom side; holes from the top side to the bottom side;
      a metallization pattern on the top side, comprising bonding pads corresponding to the integrated circuit chip interconnection pads, the bonding pads connected by conductive runners to corresponding holes positioned away from the bonding pads; and
      an array of solder bumps on the bottom side, each bump extending through a hole and connected to the metallization pattern, the distance between the individual solder bumps being greater than the distance between the individual bonding pads; and
   the integrated circuit chip attached to the bonding pads by means of the electrically conducting bumps, at least some of the holes being covered by the active surface of the integrated circuit chip, and the length and width of the circuit carrying substrate each being a maximum of about 0.1 inches greater than the length and width of the integrated circuit chip.

8. The semiconductor device assembly of claim 7, further comprising an organic coupling agent disposed between the integrated circuit chip and the substrate, covering at least a portion of the active surface.

9. The semiconductor device assembly of claim 7, wherein the electrically conducting bumps comprise solder.

10. A semiconductor device assembly, comprising:
   an integrated circuit chip having interconnection pads disposed on a perimeter of an active surface of the chip;
   a printed circuit board having plated through holes and two opposed sides;
      a first side having a circuitry pattern comprising bonding pads substantially corresponding to the integrated circuit chip interconnection pads and circuit traces coupling the bonding pads to the plated through holes;,
      a second side having a plurality of solder pads that are connected to the plated through holes, most of the plated through holes positioned away from the corresponding solder pads, the minimum spacing between the plurality of solder pads being greater than the minimum spacing between the bonding pads, at least some of the plated through holes being disposed in an area under the integrated circuit chip, and the length and width of the printed circuit board each being a maximum of about 0.1 inches greater than the length and width of the integrated circuit chip;
      a solder bump on each solder pad; and
   means for electrically and mechanically coupling the integrated circuit chip to the bonding pads, comprising bumps of electrically conducting material;
   the integrated circuit chip mounted with the active surface facing the first side of the printed circuit board, the electrically conducting material coupling the interconnection pads and the bonding pads; and
   an epoxy resin disposed between the integrated circuit chip and the first side of the printed circuit board, covering at least a portion of the active surface.

11. The semiconductor device assembly of claim 10, wherein the printed circuit board comprises an organic resin reinforced with aramid.

12. A semiconductor device assembly, comprising:
   an integrated circuit chip having a length, a width, and an active surface having interconnection pads disposed thereon;
   a circuit carrying substrate having;
      a length, a width, a top side, and a bottom side; holes corresponding to the interconnection pads;
      a metallization pattern on the bottom side, comprising an array of solder pads connected by conductive runners to corresponding holes positioned away from the solder pads, the distance between the individual solder pads being greater than the distance between the individual interconnection pads; and the integrated circuit chip attached to the metallization pattern by means of electrically conducting bumps that extend from the interconnection pads through the holes and connect to the metallization pattern, at least some of the holes being covered by the active surface of the integrated circuit chip, and the length and width of the circuit carrying substrate each being a maximum of about 0.1 inches greater than the length and width of the integrated circuit chip.

13. The semiconductor device assembly of claim 12, further comprising an organic coupling agent disposed between the integrated circuit chip and the substrate, covering at least a portion of the active surface.

14. The semiconductor device assembly of claim 12, wherein the electrically conducting bumps comprise solder.

* * * * *